(12) United States Patent
Weidman et al.

(10) Patent No.: US 7,465,358 B2
(45) Date of Patent: Dec. 16, 2008

(54) MEASUREMENT TECHNIQUES FOR CONTROLLING ASPECTS OF A ELECTROLESS DEPOSITION PROCESS

(75) Inventors: Timothy W. Weidman, Sunnyvale, CA (US); Dmitry Lubomirsky, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 805 days.

(21) Appl. No.: 10/794,592

(22) Filed: Mar. 5, 2004

(65) Prior Publication Data
US 2005/0084615 A1   Apr. 21, 2005

Related U.S. Application Data

(60) Provisional application No. 60/511,236, filed on Oct. 15, 2003.

(51) Int. Cl.
*B05C 11/00* (2006.01)
(52) U.S. Cl. .................. 118/667; 118/666; 118/429
(58) Field of Classification Search ......... 118/666–667, 118/689–690, 429; 205/82, 84; 204/228.1, 204/228.6; 134/107, 113
See application file for complete search history.

(56) References Cited

U.S. PATENT DOCUMENTS

| | | | |
|---|---|---|---|
| 3,900,599 A * | 8/1975 | Feldstein | ............ 427/97.7 |
| 4,276,323 A | 6/1981 | Oka et al. | |
| 4,350,717 A | 9/1982 | Araki et al. | |
| 4,684,545 A | 8/1987 | Fey et al. | |
| 4,922,277 A | 5/1990 | Carlson et al. | |
| 4,998,068 A | 3/1991 | McKee, Jr. | |
| 5,172,332 A | 12/1992 | Hungerford et al. | |

(Continued)

FOREIGN PATENT DOCUMENTS

| | | |
|---|---|---|
| EP | 1 496 542 A2 | 1/2005 |
| WO | WO 02/083981 A1 | 10/2002 |
| WO | WO 03/014416 A2 | 2/2003 |
| WO | WO 2005/036615 A2 | 4/2005 |

OTHER PUBLICATIONS

International Search Report dated Jul. 8, 2005 for corresponding PCT application, PCT/US2004/034456.

*Primary Examiner*—Brenda A Lamb
(74) *Attorney, Agent, or Firm*—Patterson & Sheridan

(57) ABSTRACT

Embodiments of the invention generally provide a fluid processing chamber, sensors and a controller and method for using the same. The fluid processing chamber includes an inlet region, a processing region and an outlet region. The inlet region generally contains one or more sensors and an external controller to monitor the characteristics of the processing fluid at the inlet to the processing region. The outlet region generally contains one or more sensors and an external controller to monitor the characteristics of the processing fluid leaving the processing region of the chamber. In one embodiment the processing region contains one or more sensors and an external controller to monitor the characteristics of the processing fluid in the processing region. The sensors may include, for example, an ORP probe, a temperature sensor, a conductivity sensor, a dissolved hydrogen sensor, a dissolved oxygen sensor, and a pH sensor. The fluid processing chamber is generally useful for all process steps done to deposit an electroless deposited film on a substrate including, for example, all pre-clean process steps (substrate preparation steps), all electroless activation process steps, all electroless deposition steps, and all post electroless deposition cleaning steps.

1 Claim, 12 Drawing Sheets

U.S. PATENT DOCUMENTS

| | | |
|---|---|---|
| 5,368,718 A | 11/1994 | Conrod et al. |
| 5,798,940 A | 8/1998 | Bratton et al. |
| 6,488,984 B1 | 12/2002 | Wada et al. |
| 6,632,335 B2 | 10/2003 | Kunisawa et al. |
| 2004/0065540 A1 | 4/2004 | Mayer et al. |
| 2004/0137161 A1 | 7/2004 | Segawa et al. |
| 2004/0154535 A1 | 8/2004 | Chen et al. |

* cited by examiner

MEASUREMENT TECHNIQUES FOR CONTROLLING ASPECTS OF A ELECTROLESS DEPOSITION PROCESS

CROSS-REFERENCE TO RELATED APPLICATIONS

This application claims benefit of U.S. patent application Ser. No. 60/511,236, filed Oct. 15, 2003, entitled "Apparatus for Electroless Deposition," and is herein incorporated by reference.

BACKGROUND OF THE INVENTION

1. Field of the Invention

Embodiments of the invention generally relate to a processing chamber, sensors and controls for conducting an electroless plating process.

2. Description of the Related Art

Metallization of sub-quarter micron sized features is a foundational technology for present and future generations of integrated circuit manufacturing processes. More particularly, in devices such as ultra large scale integration-type devices, i.e., devices having integrated circuits with more than a million logic gates, the multilevel interconnects that lie at the heart of these devices are generally formed by filling high aspect ratio, i.e., greater than about 4:1, interconnect features with a conductive material, such as copper. Conventionally, deposition techniques such as chemical vapor deposition and physical vapor deposition have been used to fill these interconnect features. However, as the interconnect sizes decrease and aspect ratios increase, void-free interconnect feature fill via conventional metallization techniques becomes increasingly difficult. As a result, plating techniques, i.e., electrochemical plating and electroless plating, have emerged as promising processes for void free filling of sub-quarter micron sized high aspect ratio interconnect features in integrated circuit manufacturing processes. Further, plating processes, and in particular, electroless plating processes have emerged as promising processes for depositing post deposition layers, such as capping layers, for example.

However, with regard to electroless plating processes, conventional processing apparatuses and methods have faced substantial challenges in accurately controlling the electroless deposition process and the defect ratios in the resulting deposition layers. Since there is generally no way to know when the electroless process has initiated, and the initiation time varies from substrate to substrate or from one area of a substrate to another it is hard to know when the desired thickness of material has been deposited across the surface of the substrate. Further, monitoring and controlling various process steps, such as rinsing the substrate between electroless deposition process steps or after the process has been completed, can prevent the interaction of incompatible chemistries, reduce cross contamination to subsequent processes, and minimize the amount of wasted time necessary to assure the substrate has been sufficiently processed. To compensate for the process variation and unknown processing time, engineers will often use a worst case processing time to assure that a desired amount of material is deposited or the substrate is sufficiently processed. Use of a worst case process time causes the throughput of the processing chamber to suffer and is wasteful of the often expensive electroless deposition solutions, contaminate subsequent process which all lead to substrates variability and possibly scrap. Monitoring and controlling the state of the electroless deposition process is an important part of assuring a uniform layer is deposited with minimal defects.

Therefore, there is a need for an improved apparatus and method for monitoring and controlling various aspects of the electroless deposition process.

SUMMARY OF THE INVENTION

Aspects of the invention provides a system for monitoring and controlling an electroless process chamber by monitoring the processing fluid in contact with the processing surface of a substrate. The system includes a chamber, a probe, and a controller adapted to receive and process the signals from the probe. The controller is further adapted to control the electroless deposition system.

Another aspect of the invention provides a system for monitoring and controlling an electroless process chamber by monitoring the processing fluid in contact with the processing surface of a substrate. The system includes a chamber, a first probe, a second probe, and a controller adapted to receive and process the signals from the first and second probes. The controller is further adapted to control the electroless deposition system.

Another aspect of the invention provides a system for monitoring and controlling an electroless process chamber by monitoring the processing fluid in contact with the processing surface of a substrate. The system includes a chamber, a first probe, a second probe, a third probe and a controller adapted to receive and process the signals from the first, second and third probes. The controller is further adapted to control the electroless deposition system.

Aspects of the invention provide a method of improving an electroless deposition process by positioning a substrate in a process chamber, flowing processing fluid past a first temperature sensor, the substrate and a second temperature sensor, and monitoring the difference between the temperature sensors and starting the electroless deposition process when the difference between the two temperature sensors reaches a user defined value.

Another aspect of the invention provides a method of improving an electroless deposition process by: Cleaning a processing surface of the substrate by: starting a flow of a cleaning chemistry, monitoring an output signal of a sensor, starting a process timer when the sensor reaches a user defined value, and ending the cleaning process when the process timer reaches a user defined value; electrolessly depositing a layer on the processing surface of the substrate; rinsing/cleaning the processing surface of the substrate by: starting a flow of a rinsing chemistry, monitoring an output of a sensor, starting a process timer when the sensor output reaches a user defined value, and ending the rinsing process when the process timer reaches a user defined value; and ending the electroless deposition process.

Another aspect of the invention provides a method of improving an electroless deposition process by: Cleaning a processing surface of the substrate by: starting a flow of a cleaning chemistry, monitoring an output signal of a sensor, starting a process timer when the sensor reaches a user defined value, and ending the cleaning process when the process timer reaches a user defined value; rinsing the processing surface of the substrate by: starting a flow of a rinsing chemistry, monitoring an output of a sensor, starting a process timer when the sensor output reaches a user defined value, and ending the rinsing process when the process timer reaches a user defined value; electrolessly depositing a layer on the processing surface of the substrate; rinsing/clean the processing surface of the substrate by: starting a flow of a rinsing chemistry, monitoring an output of a sensor, starting a process timer when the sensor output reaches a user defined value, and ending the rinsing process when the process timer reaches a user defined value; and ending the electroless deposition process.

Another aspect of the invention provides a method of improving an electroless deposition process by: Cleaning a processing surface of the substrate by: starting a flow of a cleaning chemistry, monitoring an output signal of a sensor, starting a process timer when the sensor reaches a user defined value, and ending the cleaning process when the process timer reaches a user defined value; rinsing the processing surface of the substrate by: starting a flow of a rinsing chemistry, monitoring an output of a sensor, starting a process timer when the sensor output reaches a user defined value, and ending the rinsing process when the process timer reaches a user defined value; cleaning a processing surface of the substrate by: starting a flow of a cleaning chemistry, monitoring an output signal of a sensor, starting a process timer when the sensor reaches a user defined value, and ending the cleaning process when the process timer reaches a user defined value; rinsing the processing surface of the substrate by: starting a flow of a rinsing chemistry, monitoring an output of a sensor, starting a process timer when the sensor output reaches a user defined value, and ending the rinsing process when the process timer reaches a user defined value; electrolessly depositing a layer on the processing surface of the substrate; rinsing/clean the processing surface of the substrate by: starting a flow of a rinsing chemistry, monitoring an output of a sensor, starting a process timer when the sensor output reaches a user defined value, and ending the rinsing process when the process timer reaches a user defined value; and ending the electroless deposition process.

Another aspect of the invention provides a method of improving an electroless deposition process by: Cleaning a processing surface of the substrate by: starting a flow of a first cleaning chemistry, monitoring an output signal of a sensor, starting a process timer when the sensor reaches a user defined value, and ending the cleaning process when the process timer reaches a user defined value; cleaning a processing surface of the substrate by: starting a flow of a second cleaning chemistry, monitoring an output signal of a sensor, starting a process timer when the sensor reaches a user defined value, and ending the cleaning process when the process timer reaches a user defined value; electrolessly depositing a layer on the processing surface of the substrate; rinsing/clean the processing surface of the substrate by: starting a flow of a rinsing chemistry, monitoring an output of a sensor, starting a process timer when the sensor output reaches a user defined value, and ending the rinsing process when the process timer reaches a user defined value; and ending the electroless deposition process.

Aspects of the invention provide a method of cleaning a substrate surface in a process chamber by starting a flow of a cleaning chemistry, monitoring an output signal of a sensor, starting a process timer when the sensor reaches a user defined value, and ending the cleaning process when the process timer reaches a user defined value; and ending the cleaning process when the process timer reaches a user defined value.

Another aspect of the invention provide a method of cleaning a substrate surface in a process chamber by: starting a flow of a cleaning chemistry past a first temperature sensor, a second temperature sensor and a sensor; monitoring the output of the sensor; monitoring the temperature of the first temperature sensor and the second temperature senor; starting a first process timer when the sensor output reaches a user defined value; starting a second process timer when the difference between the first temperature senor and the second temperature sensor reaches a user defined value; and ending the cleaning process when the first process timer or the second process timer reaches a user defined value.

Aspects of the invention provide a method of rinsing a substrate surface in an electroless process chamber by inserting a substrate into the process chamber, starting a flow of a rinsing chemistry into the process chamber past a the substrate and a sensor, monitoring the output of the sensor, starting a process timer when the rinsing chemistry conductivity reaches a user defined value, and ending the cleaning process when the process timer reaches a user defined value.

Aspects of the invention provide a method of improving an electroless process by flowing a processing fluid into a fluid process chamber where the process fluid contacts the substrate surface, monitoring an output of a sensor that is in contact with the process fluid; starting a first process timer when the sensor output reaches a user defined value; and ending the electroless deposition process when the first process timer reaches a user defined value.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Embodiments of the invention generally provide an integrated electroless processing chamber that utilizes various process monitoring techniques to monitor and control the various electroless process steps, electroless chamber and supporting components. The electroless processing chamber can be a stand alone chamber or be integrated into a processing platform containing many pre- and post-electroless process chamber components. The term electroless process (or electroless deposition process) is meant to generally cover all process steps done to deposit an electroless deposited film onto a substrate including, for example, one or more of the pre-clean process steps (substrate preparation steps), the electroless activation process steps, the electroless deposition steps, and the post deposition cleaning steps. An exemplary electroless deposition processes is described in U.S. patent application Ser. No. 60/512,334, entitled "Self-activating Electroless Deposition Process for CoWP Alloy" filed on Oct. 17, 2003, which are incorporated by reference herein to the extent not inconsistent with the claimed aspects and disclosure herein. Many of the monitoring methods described herein also apply to palladium (Pd), or other noble metal, activated processes which are well known in the art. An exemplary electroless deposition processes is described in the U.S. patent application Ser. No. 10/059,851, entitled "Method of Depositing a Catalytic Layer", filed on Jan. 28, 2002, which are incorporated by reference herein to the extent not inconsistent with the claimed aspects and disclosure herein.

Figure 1:
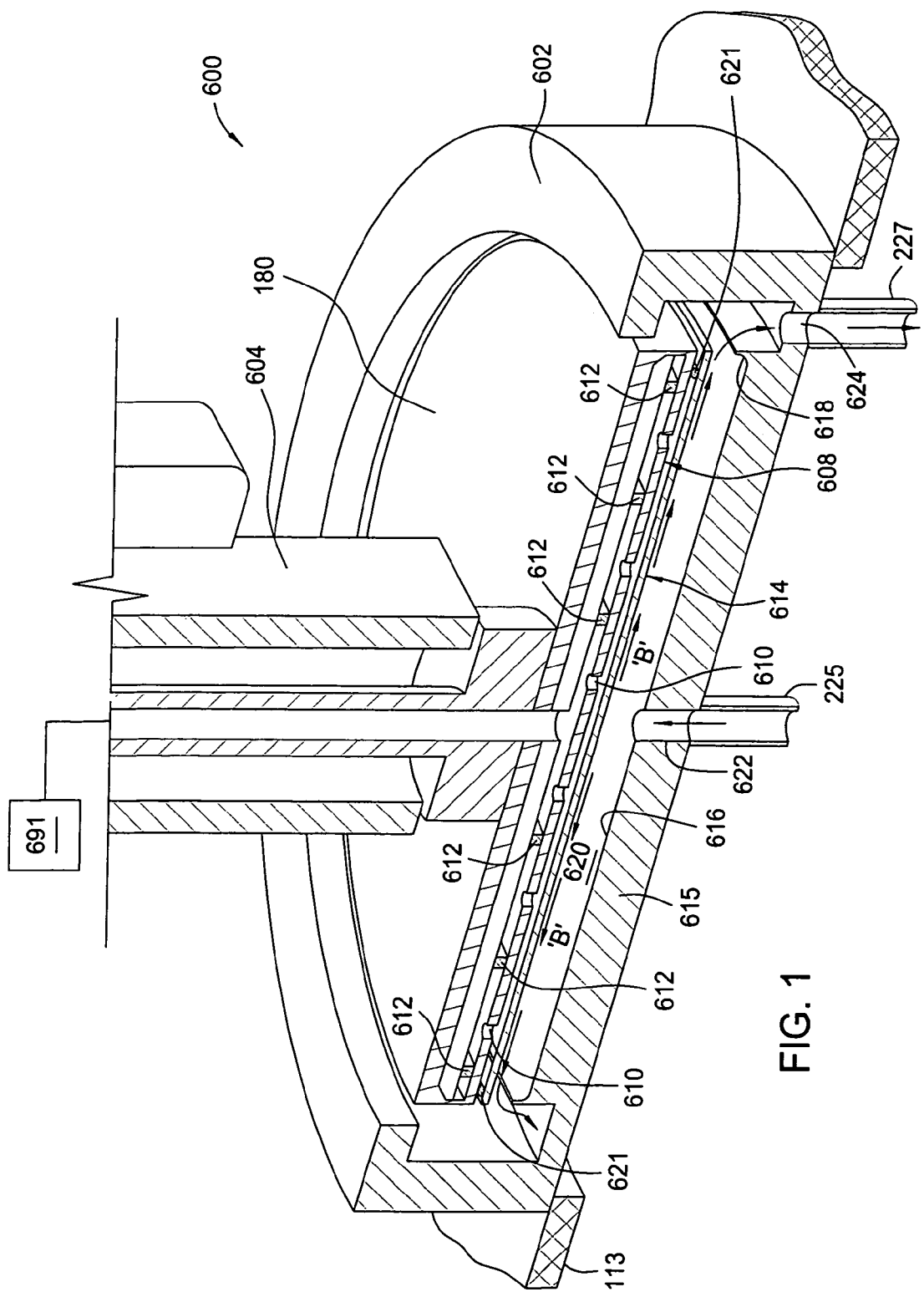
FIG. 1 shows a schematic cross-sectional view of a face-down electroless processing chamber.
Figure 3:
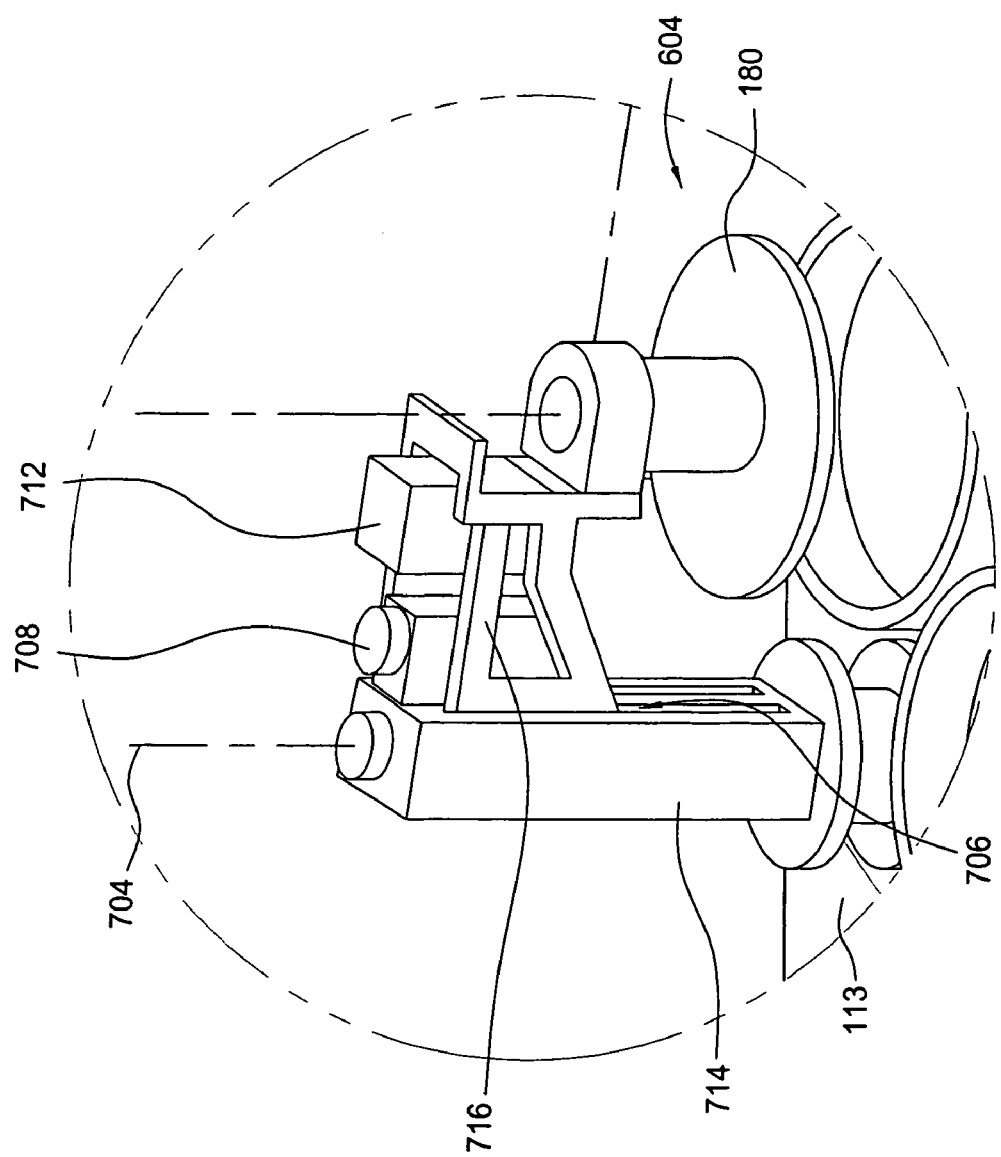
FIG. 3 shows a schematic view of a head assembly used in the electroless processing chamber.

FIG. 1 illustrates a perspective and partial sectional view of an exemplary fluid processing cell 600 and a head assembly 604 of the present invention. The fluid processing cell 600 may be used as an electroless plating cell, an activation cell, and/or a cleaning cell in any of the embodiments described herein. The fluid processing cell 600 generally includes a cell body 602 having a head assembly 604 that is movably positioned above the cell body 602. The fluid processing cell 600 and head assembly 604 are both supported or mounted to a mainframe 113. The cell body may be manufactured from various substances known to be nonreactive with fluid processing (electroless or ECP) solutions, such as plastics, polymers, and ceramics, for example. The head assembly 604, which is also illustrated in FIG. 3, generally includes a substrate support member 180 that is configured to rotate, horizontally or pivotally actuate, and vertically actuate as well as being sized to be received within the opening of cell body 602. The substrate support member 180 includes a substrate support surface 608 that has a plurality of vacuum apertures 610 formed therein. The vacuum apertures 610 are selectively in fluid communication with a vacuum source 691, and as such, the vacuum apertures 610 may be used to vacuum chuck a substrate 614 to the substrate support surface 608. The lower surface of the substrate support member 180 may be coated or manufactured from a material that is nonreactive with fluid processing solutions, such as ceramics or plastics. An annular seal 621, such as an o-ring type seal, for example, is positioned near the perimeter of the substrate support surface 608. The annular seal 621 is generally configured to engage the backside of the substrate 614 being vacuum chucked to the substrate support surface 608 to create a vacuum tight seal between the substrate support surface 608 and the substrate 614 to facilitate the vacuum chucking process, while also minimizing the amount of fluid contacting the backside of the substrate.

The interior of the substrate support member 180 may include a heater 612, which may comprise a plurality of concentrically positioned heating bands. The heating bands may include resistive heaters, fluid passages configured to have a heated fluid flowed therethrough, or another method of heating a substrate support member. The plurality of heating bands may be individually controlled, if desired, to more accurately control the substrate temperature during processing. More particularly, individual control over the heating bands allows for precise control over the substrate surface, which is critical to electroless plating processes. The substrate support member 180 may further include an actuator or vibration device (not shown) configured to impart megasonic or other vibrational energy to substrate 614 during processing.

A bottom central portion of the cell body 602 includes a fluid processing basin 615. The fluid processing basin 615 generally includes a substantially planar basin surface 616 having an annular fluid weir 618 circumscribing the basin surface 616. The annular fluid weir 618 generally has a height of between about 2 mm and about 20 mm, and is generally configured to maintain a processing fluid in a puddle-type configuration on the basin surface 616 in a processing region 620. The basin surface 616 also includes one or more fluid apertures 622 formed therein. The fluid aperture 622 are generally in fluid communication with a plurality of processing fluid sources, such as rinsing solution sources, activation solution sources, cleaning solution sources, electroless deposition solution sources, and other fluid sources that may be used in an electroless deposition process. As such, aperture 622 may be used to supply processing fluids to the processing region 620. In the embodiment shown in FIG. 1 a processing fluid will generally flow upward through the inlet tubing 225 then through the aperture 622, and then outward through the processing region 620 towards the annular fluid weir 618, as indicated by arrows "B". A fluid drain 624 is generally positioned in an outer lower portion of the cell body 602, generally outward of the annular fluid weir 618. As such, the fluid drain 624 and the outlet tubing 227 is configured to collect fluid that overflows the annular fluid weir 618.

Figure 2:
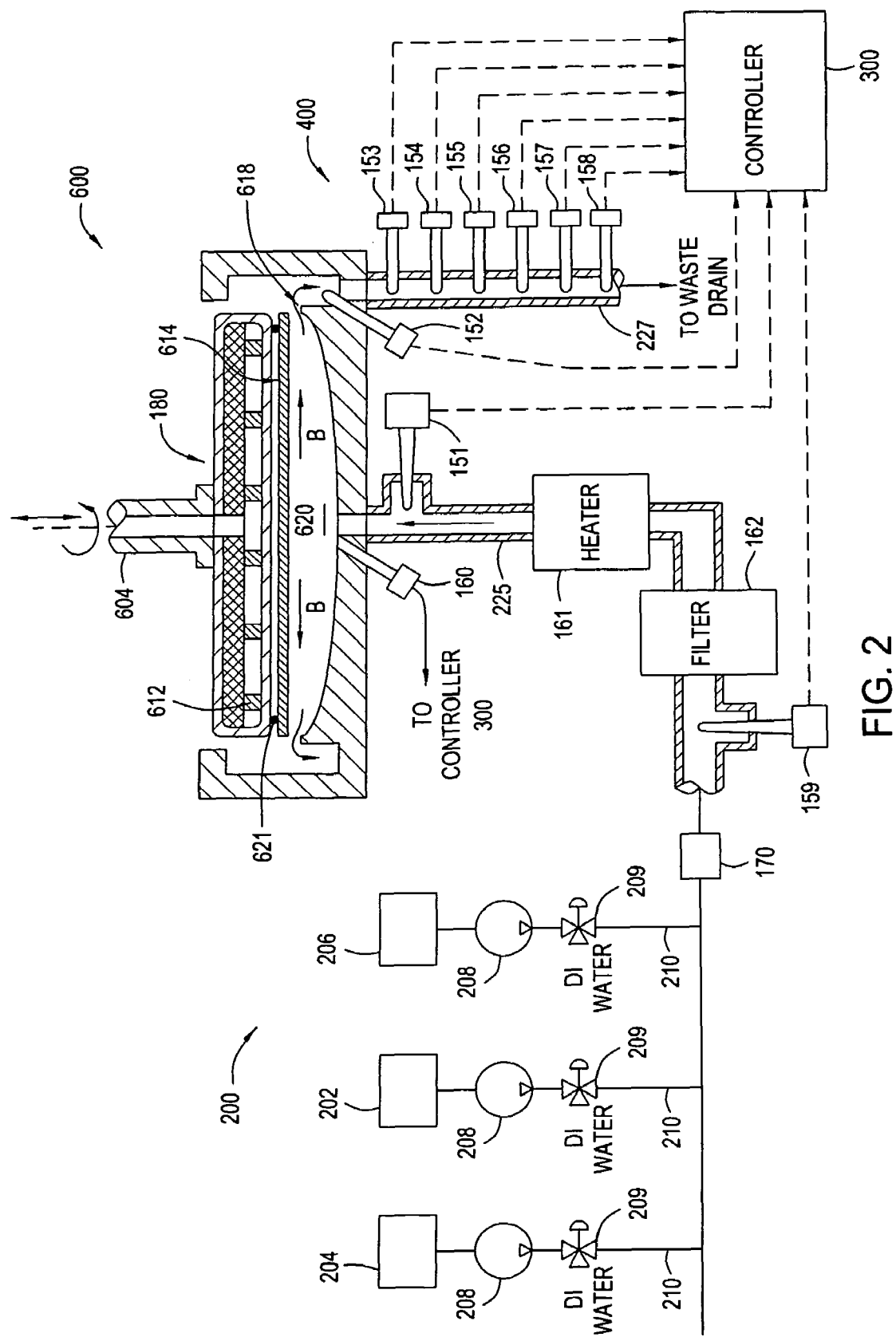
FIG. 2 shows a schematic cross-sectional view of a face-down electroless processing chamber and the inlet and outlet sections.

FIG. 2 illustrates a cross-sectional view of the fluid processing cell 600 and schematically depicts various plumbing and hardware elements found in the inlet section 200 and outlet section 400 of the present invention. The inlet section 200 of FIG. 2 generally contains various processing fluid sources (e.g., solution A source 202, solution B source 204 and solution C source 206, etc.), metering pumps 208, dispense valves 209 and the inlet tubing 225. The number of various processing fluids that can be used in the fluid processing cell 600 will vary depending on the application and will likely be more than the three as shown in FIG. 2. As generally depicted in FIG. 2 the dispense valve 209 can be configured to rinse the foreline 210 after chemistry has been delivered from the process fluid source upstream of the dispense valve.

Each of the respective components found in the fluid processing cell 600 (e.g., head assembly 604, inlet section 200, outlet section 400, etc.), and other external system components (discussed below) communicate with a process controller 300, which may be a microprocessor-based control system configured to receive inputs from both a user and/or various sensors positioned on the system, and appropriately control the operation of the chamber and external system in accordance with the inputs. The controller 300 contains memory (not shown) and a CPU (not shown) which are utilized by the controller to retain various programs, process the programs, and execute the programs when necessary. The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits (not shown) are also connected to the CPU for supporting the processor in a conventional manner. The support circuits may include cache, power supplies, clock circuits, input/output circuitry, subsystems, and the like all well known in the art. A program (or computer instructions) readable by the controller 300 determines which tasks are performable in the processing chamber. Preferably, the program is software readable by the controller 300 and includes instructions to monitor and control the electroless process based on defined rules and input data.

A filter 162 is optionally incorporated in the inlet section 200 to prevent particles generated upstream from the filter from contaminating the fluid processing cell 600 and ultimately the substrate 614. In cases where the inlet line 225 needs to be rinsed prior to removing the substrate, or in between process steps, the addition of a filter can greatly increase the time it takes to rinse the line due to the large surface area of the filter membranes and thus may not be used.

In one embodiment of the inlet section 200, a probe 151 is mounted into the inlet line 225 to measure the properties of the processing fluid just prior to the injection into the chamber. The probe 151, for example, may be a temperature probe such a thermocouple and is used to measure the temperature of the processing fluid as it enters the processing region 620 of the fluid processing cell 600. In some cases it may be advantageous to mount the probe 151 to the fluid processing basin 615, the fluid aperture 622 and/or other area near the inlet of the fluid processing cell 600, rather than in the inlet line 225 as shown in FIG. 2. In another embodiment of the inlet section 200, probe 151 may be replaced with many individual sensors, such as a temperature sensor, a pH sensor, a dissolved oxygen sensor, a dissolved $H_2$ sensor, and/or a conductivity sensor can be mounted to the fluid processing basin 615, the fluid aperture 622 or other area near the inlet of the fluid processing cell 600 (not shown).

In another aspect of the invention a heater 161 is incorporated into the inlet section 200 to heat the fluid before it enters the processing region 620. The heater 161 contemplated in this invention can be any type of device that imparts energy into the processing fluid. Preferably the heater is a jacketed type resistive heater (e.g., heater heats the fluid through the wall of the inlet tubing) rather than an immersion type heater (e.g., heater element touches the solution). The heater 161, used in conjunction with a controller 300 and probe 151, can be utilized to assure that the temperature of the processing fluid entering the processing region 620 of the fluid processing cell 600 is at a desired temperature.

In another aspect of the invention, the heater 161 is a microwave power source and flow through microwave cavity used to rapidly impart energy into the processing fluid. In on embodiment the microwave power source is run at 2.54 GHz at a power from about 500 W to about a 2000 W. In one embodiment of an in-line microwave cavity heater, increases the temperature of the various solutions (e.g., cleaning chemistry, rinse solution, and post clean solution, etc.) up to an optimal level immediately before entering the processing cell.

In another aspect of the invention a fluid degassing unit 170 is incorporated into the inlet section 200 to remove any trapped, or dissolved gas, in the processing fluid before it enters the processing region 620. Since dissolved oxygen tends to inhibit the electroless deposition reactions, oxidize exposed metallic surfaces and affect the etch rate during the electroless cleaning processes the use of the fluid degassing unit can help to reduce any erosion and/or process variability caused by dissolved oxygen present in the in the processing fluids. A fluid degassing unit is well known in the art and is generally described as any unit that can extract dissolved gas from a solution, for example, by use of a gas permeable membrane and a vacuum source. A fluid degassing unit can be purchased, for example, from Mykrolis Corporation of Billerica, Mass.

The outlet section 400 of the present invention generally contains an outlet line 227 that is connected to the fluid drain 624, which delivers the chamber effluent to a waste collection drain (not shown). The outlet section 400 also contains various process monitoring probes (e.g., items 152-158, etc.) that are used to monitor and control the electroless deposition process. It should be noted that FIG. 2 is a schematic representation of the placement of the probes which are all preferably mounted as close to the annular fluid weir 618 as possible, so that they can measure the properties of the processing fluid as it leaves the processing region 620. The arrangement, distance from annular fluid weir 618 and orientation (horizontal or vertical) of the process monitoring probes (e.g., items 152-158, etc.) can be varied as needed to assure that the probes are in contact with the processing fluid and the data collected is not subject to any external noise sources that can affect the ability of the system to monitor the electroless deposition process. Probe 152 is a temperature sensor that is used to monitor the temperature of the processing fluid leaving the processing region 620. Probe 153 is an Oxidation/Reduction Potential probe (commonly known as an ORP probe) used to measure the activity of the processing fluid leaving the processing region 620. An ORP probe measures the electron exchange potential that occurs in an ionic reaction and is well known in the art. Probe 154 is a dissolved oxygen sensor which is used to monitor the concentration of dissolved oxygen in processing fluid leaving the processing region 620. Probe 155 is a pH probe used to measure the concentration of hydrogen ions in the processing fluid leaving the processing region 620. The concentration of hydrogen ions in the processing fluid will vary as the electroless deposition process progresses due to the oxidation of the reducing agents (e.g., hypophosphite, etc.) which creates hydroxide ions and thereby lowers the pH of the solution. ORP, pH, and dissolved oxygen probes are all well known in the art and can be purchased commercially from such companies as Sensorex Corporation of Garden Grove, Calif. or Yokogawa Corporation of America of Newnan, Ga. Probe 158 is a dissolved hydrogen probe used to measure the concentration of dissolved $H_2$ in the processing fluid in the processing region or leaving the processing region 620. A dissolved hydrogen probe that can detect the dissolved hydrogen in a solution can be a conductivity type probe or a liquid mass spectrometer type probe which are both well known in the art. The measurement of $H_2$ is especially useful during the electroless deposition process steps (method step 806 shown below) since it can be an alternate way of monitoring the activity of the electroless deposition process since the amount of $H_2$ liberated, and thus the concentration in the solution at any instant in time, is proportional to the speed of the deposition process (method step 806).

In one embodiment of the fluid processing cell 600 a conductivity sensor, probe 156, is mounted in the fluid processing cell to measure the conductivity and thus the overall ion concentration in the processing fluid. In a preferred embodiment the probe 156 is a commercially available conductivity sensor that is used to measure the conductivity and thus the overall ion concentration in the processing fluid leaving the processing region 620.

In another embodiment of the fluid processing cell 600 a first conductivity probe 159 (attached to the inlet line 225) and a second conductivity probe 157 (attached to the outlet line 227) are placed in contact with the processing fluid. The first conductivity probe 159 and second conductivity probe 157, are both made from an electrically conductive material.

In this embodiment the first conductivity probe 159 and the second conductivity probe 157 can be electrically biased relative to each other by use of a power source (not shown), so that a voltmeter (not shown), ampmeter (not shown), and the controller 300 can be used to collect and process the voltage and current data to monitor the conductivity of the processing fluid between the two probes. It should be noted that the surface of the first conductivity probe is preferably made from a non-metallic material to prevent electroless deposition on the probe which can cause the process results to vary or generate particles.

In one aspect of the invention a conductivity probe (i.e., conductivity probe 156, or first conductivity probe159 and second conductivity probe 157) in conjunction with the controller 300 are used to sense when the process areas 620 becomes full of a processing fluid. The controller 300 and conductivity probe combination can be used to sense when the processing region 620 is full by noting when the conductivity of the flowing fluid leaving the processing region 620 varies from some initial value. Using a processing fluid of a known conductivity, the controller 300 and conductivity probe can assure that the flowing processing fluid in the processing area reaches a desired concentration by monitoring and comparing the measured conductivity versus a user defined value that corresponds to a desired concentration. This embodiment will minimize the waste of the often very expensive chemistries used to complete the electroless processes by allowing the controller to regulate, or terminate the flow of a cleaning, plating or rinsing solution once some desired conductivity has been reached.

In one embodiment of the fluid processing cell 600, the probes (i.e., probes 151 through 159) are mounted such that they are in contact with the processing fluid in the processing region 620 so that they can monitor the state of the process when the electroless processing fluid flow is halted. The probe 160 in FIG. 2 illustrates one possible embodiment. In one embodiment it may be advantageous to evenly distribute one or more of each type of probe around the processing region 620 to effectively monitor the on-going electroless process. This aspect of the invention will reduce the amount of effluent from the processing cell caused by the need to flow the processing fluid past the probes outside the processing region 620 to monitor the state of the on-going process.

The head assembly 604, which is also illustrated in FIG. 3, generally includes a post member 714 that is pivotally attached to mainframe 113, and is positioned such that the post member 714 may be rotated about axis 704 to selectively position the substrate support member 180 over the processing cells. Head assembly 604 further includes an arm member 716 attached to post member 714 and extending therefrom. The arm member 716 is movably positioned to the post member 714, i.e., the vertical position of arm member 716 may be adjusted relative to the post member 714, through, for example, a gear arrangement where first geared motor 708 engages a vertical track 706 on the side of post member 714 to selectively move the arm member 716 vertically along the track 706. A second motor 712 is positioned on arm member 716 and is in communication with the substrate support member 180. The second motor is configured to impart rotational movement to the substrate support member 180. Other possible embodiments of the head assembly 604 and the substrate support member 180 are more fully disclosed in the U.S. patent application Ser. No. 60/511,236.

Figure 4:
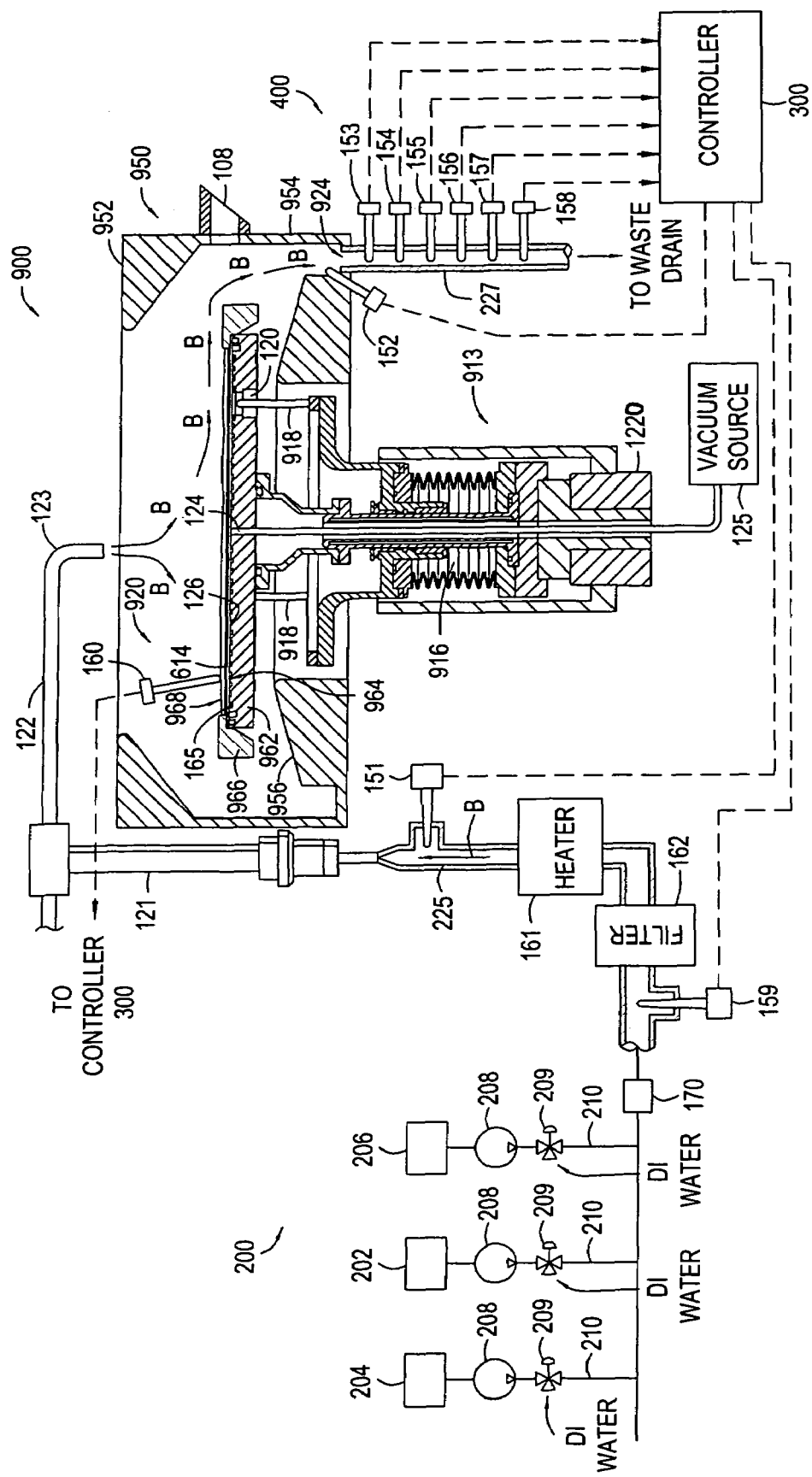
FIG. 4 shows a schematic cross-sectional view of a face-up electroless processing chamber and the inlet and outlet sections.

FIG. 4 illustrates a cross-sectional view of a "face up" version of the fluid processing cell 600, referred to as the fluid processing cell 900. The inlet section 200 and outlet section 400, as described above, are incorporated in the fluid processing cell 900, as shown in FIG. 4, and retain the same item numbers for clarity. An exemplary face up electroless deposition processing chamber is described in the U.S. patent application Ser. No. 10/059,572, entitled "Electroless Deposition Apparatus" filed on Jan. 01, 2002 and U.S. Patent provisional application Ser. No. 60/503,833 [AMAT 8651], entitled "Apparatus and Method of Detecting The Electroless Deposition Endpoint" filed on Sep. 19, 2003 which are incorporated by reference herein to the extent not inconsistent with the claimed aspects and disclosure herein.

The fluid processing cell 900 includes a processing compartment 950 comprising a top 952, sidewalls 954, and a bottom 956. A substrate support member 962 is disposed in a generally central location in the fluid processing cell 900, and includes a substrate receiving surface 964 adapted to receive a substrate 614 in a face-up position. The fluid processing cell 900 further includes a clamp ring 966 configured to hold the substrate 614 against the substrate receiving surface 964. In one aspect, the clamp ring 966 improves the heat transfer between substrate 614 and the heated substrate support member 962. Typically the substrate support member 962 may heated by use of an external power source and one or more resistive elements embedded in the substrate support member 962. In another aspect, the clamp ring 966 holds the substrate during rotation of the substrate support member 962. In still another aspect, the thickness of the clamp ring 966 is used to form a pool of processing fluid 968 on the surface of the substrate 614 during processing.

While not shown in FIG. 4, one embodiment of the face-up version of invention contemplates the insertion of the various probes (e.g. probe 151-160, etc.) just prior to the formation of the pool of processing fluid 968 or while the pool of processing fluid 968 is retained on the surface of the substrate 614. The data collected while the probes are immersed in the pool of processing fluid 968 will more accurately reflect the properties of the fluid, and thus the electroless process occurring at the surface of the substrate. Immersion of the probes in the pool of processing fluid 968 will also allow monitoring of the electroless process if the processing fluid flow is halted.

The fluid processing cell 900 further includes a slot 108 or opening formed through a wall thereof to provide access for a robot (not shown) to deliver and retrieve the substrate 614 to and from the fluid processing cell 900. Alternatively, the substrate support member 962 may raise the substrate 614 through the top 952 of the processing compartment to provide access to and from the fluid processing cell 900. The fluid processing cell 900 further includes a drain 924 in order to collect and expel fluids used in the fluid processing cell 900.

A lift assembly 916 may be disposed below the substrate support member 962 and coupled to lift pins 918 to raise and lower lift pins 918 through apertures 120 in the substrate support member 962. The lift pins 918 raise and lower the substrate 614 to and from the substrate receiving surface 964 of the substrate support member 962. The lift assembly may also be adapted to detach and engage the clamp ring 966 to the surface of substrate 614 to allow the substrate to be clamped to the surface of the substrate support member 962 in one case and in another case to allow the substrate 614 to be transferred from the fluid processing cell 900.

A motor 1220 may be coupled to the substrate support member 962 to rotate the substrate support member 962 to spin the substrate 614. In one embodiment, the lift pins 918 may be disposed in a lower position below the substrate support member 962 to allow the substrate support member 962 to rotate independently of the lift pins 918. In another embodiment, the lift pins 918 may rotate with the substrate support member 962.

The substrate support member 962 may be heated to heat the substrate 614 to a desired temperature. The substrate receiving surface 964 of the substrate support member 962 may be sized to substantially receive the backside of the substrate 614 to provide uniform heating of the substrate 614. Uniform heating of a substrate is an important factor in order to produce consistent processing of substrates, especially for deposition processes having deposition rates that are a function of temperature.

A fluid input, such as a nozzle 123, may be disposed in the fluid processing cell 900 to deliver a fluid, such as the processing fluid to the surface of the substrate 614. The nozzle 123 may be disposed over the center of the substrate 614 to deliver a fluid to the center of the substrate 614 or may be disposed in any position. The dispense arm 122 may be moveable about a rotatable support member 121 which is adapted to pivot and swivel the dispense arm 122 and the nozzle 123 to and from the center of the substrate 614. The processing fluid will generally flow through the inlet tubing 225 then through the rotatable support member 121, through the dispense arm 122, through the nozzle 123, and then outward through the processing region 920 towards the clamp ring 966 and then out the fluid drain 924, as indicated by arrows "B". In one embodiment the nozzle 123 is an ultrasonic spray nozzle.

In one embodiment, the substrate support member 962 of fluid processing cell 900, or the substrate support member 180 in the fluid processing cell 600, are adapted to rotate the substrate. The rotational speed of the substrate support member may be varied according to a particular process being performed (e.g. deposition, rinsing, drying.) In the case of deposition, the substrate support member may be adapted to rotate at relatively slow speeds, such as between about 5 RPMs and about 150 RPMs, depending on the viscosity of the fluid, to spread the fluid across the surface of the substrate 614 by virtue of the fluid inertia. In the case of rinsing, the substrate support member may be adapted to spin at relatively medium speeds, such as between about 5 RPMs and about 1000 RPMs. In the case of drying, the substrate support may be adapted to spin at relatively fast speeds, such as between about 500 RPMS and about 3000 RPMs to spin dry the substrate 614. In one embodiment of fluid processing cell 900, the dispense arm 122 is adapted to move during dispensation of the fluid to improve fluid coverage of the substrate 614. Preferably, the substrate support member rotates during dispensation of a fluid from the nozzle 123 in order to increase throughput of the system.

The substrate support member 962 may include a vacuum port 124 coupled to a vacuum source 125 to supply a vacuum to the backside of the substrate 614 to vacuum chuck the substrate 614 to the substrate support member 962 and a vacuum seal 165. Vacuum Grooves 126 may be formed on the substrate support member 962 in communication with the vacuum port 124 to provide a more uniform vacuum pressure across the backside of the substrate 614. In one aspect, the vacuum chuck improves heat transfer between the substrate 614 and the substrate support member 962. In addition, the vacuum chuck holds the substrate 614 during rotation of the substrate support member 962.

The substrate support member 962 may comprise a ceramic material (such as alumina $Al_2O_3$ or silicon carbide (SiC)), TEFLON™ coated metal (such as aluminum or stainless steal), a polymer material, or other suitable materials. The substrate support member 962 may further comprise embedded heated elements, especially for a substrate support comprising a ceramic material or a polymer material.

The probes found in the inlet section 200 and outlet section 400 of the fluid processing cell 600, or fluid processing cell 900, are used to monitor and control the processes run in the fluid processing cell. For example, in one embodiment temperature 151 and temperature probe 152 are used together to monitor and control the temperature gradient in the processing fluid in the processing region 620 (or pool of deposition fluid 968) of the fluid processing cell. The temperature gradient is controlled by use of the probe 151 at the inlet to the processing region and probe 152 at the outlet of the processing region, by injecting heated fluid into the process region until a desired temperature gradient is achieved or utilizing the processing cell heaters (e.g., heater 612, etc.) to add energy to the processing fluid, and thus control and minimize the temperature gradient. Since many of the processes utilized to complete an electroless deposition process are very temperature sensitive, the control of the temperature gradient across the substrate surface can have a dramatic effect on the uniformity of an electrolessly deposited film.

Electroless Process Monitoring

The fluid processing cell 600, or fluid processing cell 900, in one embodiment of the present invention, may be used to deposit a capping layer onto exposed metallic regions on a substrate via an electroless deposition process. This process begins with the substrate support member 180 (or substrate support member 962) receiving a substrate from a transfer robot (not shown) that has a dielectric layer with features formed into the dielectric layer, and a conductive material (generally copper) filling the features thereon. The substrate used in a capping layer deposition process generally has a substantially planar production surface, formed by CMP, that contains areas of exposed dielectric material and exposed metallic areas (e.g., copper features) which are connected to underlying semiconductor devices. An example of an exemplary process is described in the U.S. patent application Ser. No. 60/512,334 entitled "Self-activating Electroless Deposition Process for CoWP Alloy" filed on Oct. 17, 2003.

Figure 5:
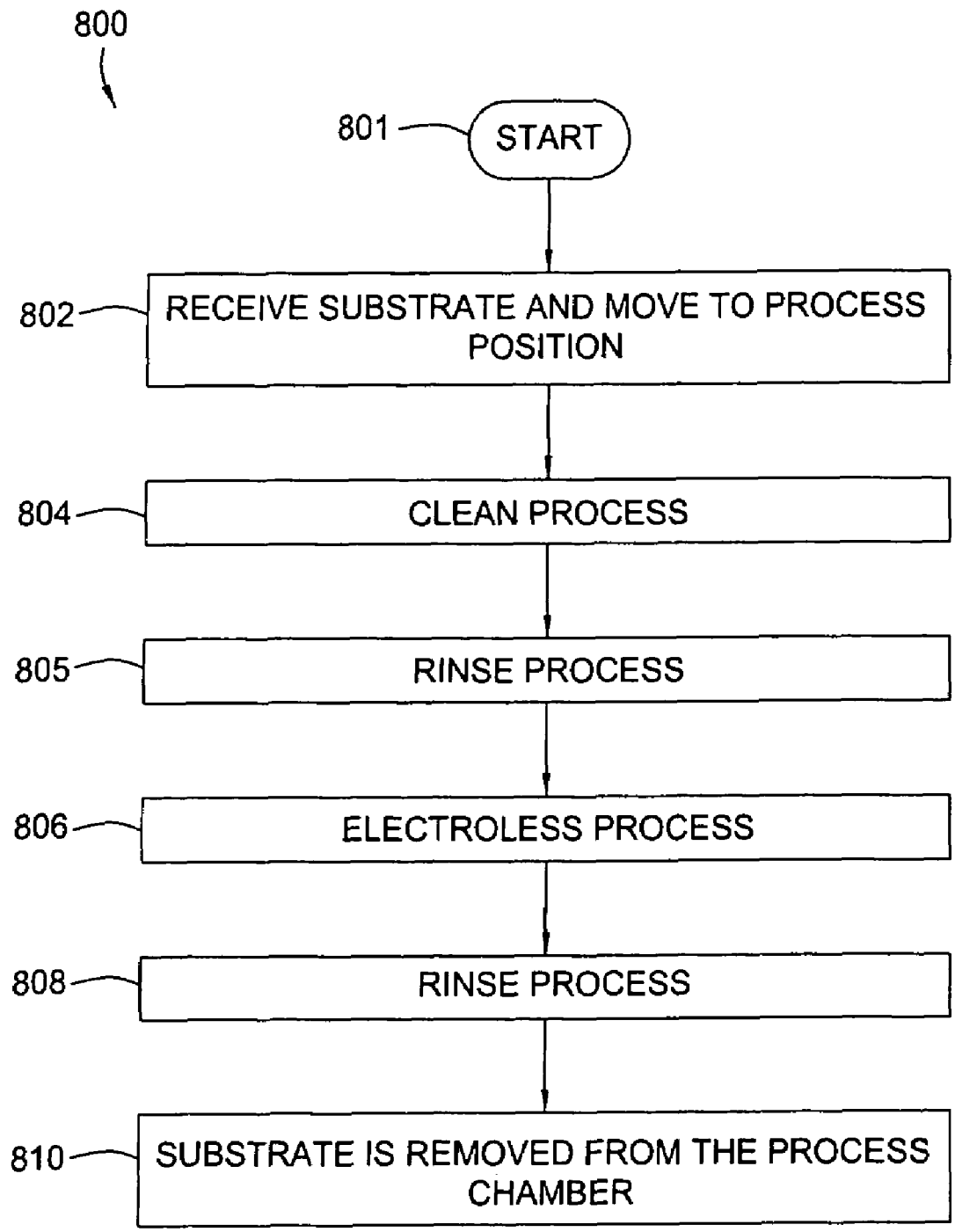
FIG. 5 illustrates one embodiment the method steps 800 for completing an electroless process.

Various methods used to monitor and control the electroless deposition process are shown in FIGS. 5 through 8. The fluid processing cell 600 and fluid processing cell 900 can be used interchangeably in the electroless process monitoring embodiments described below. FIG. 5 illustrates a series of method steps 800, which include steps 801 through 810, that generally describe the basic steps completed during an exemplary electroless deposition process. Specifically, FIG. 5 begins at step 801, the substrate is then received by the head assembly 604 in the fluid processing cell 600 and is moved into a processing position (step 802), a cleaning process is completed on the substrate (step 804), the substrate is rinsed using a rinsing solution (step 805), an electroless process is completed on the substrate (step 806), the substrate is rinsed and/or cleaned (step 808) and then the substrate is removed from the chamber (step 810). The process position, as noted in step 802, is generally defined as a position where the substrate is in contact with the processing fluid and positioned such that the electroless process can be completed on the surface of the substrate.

Figure 7:
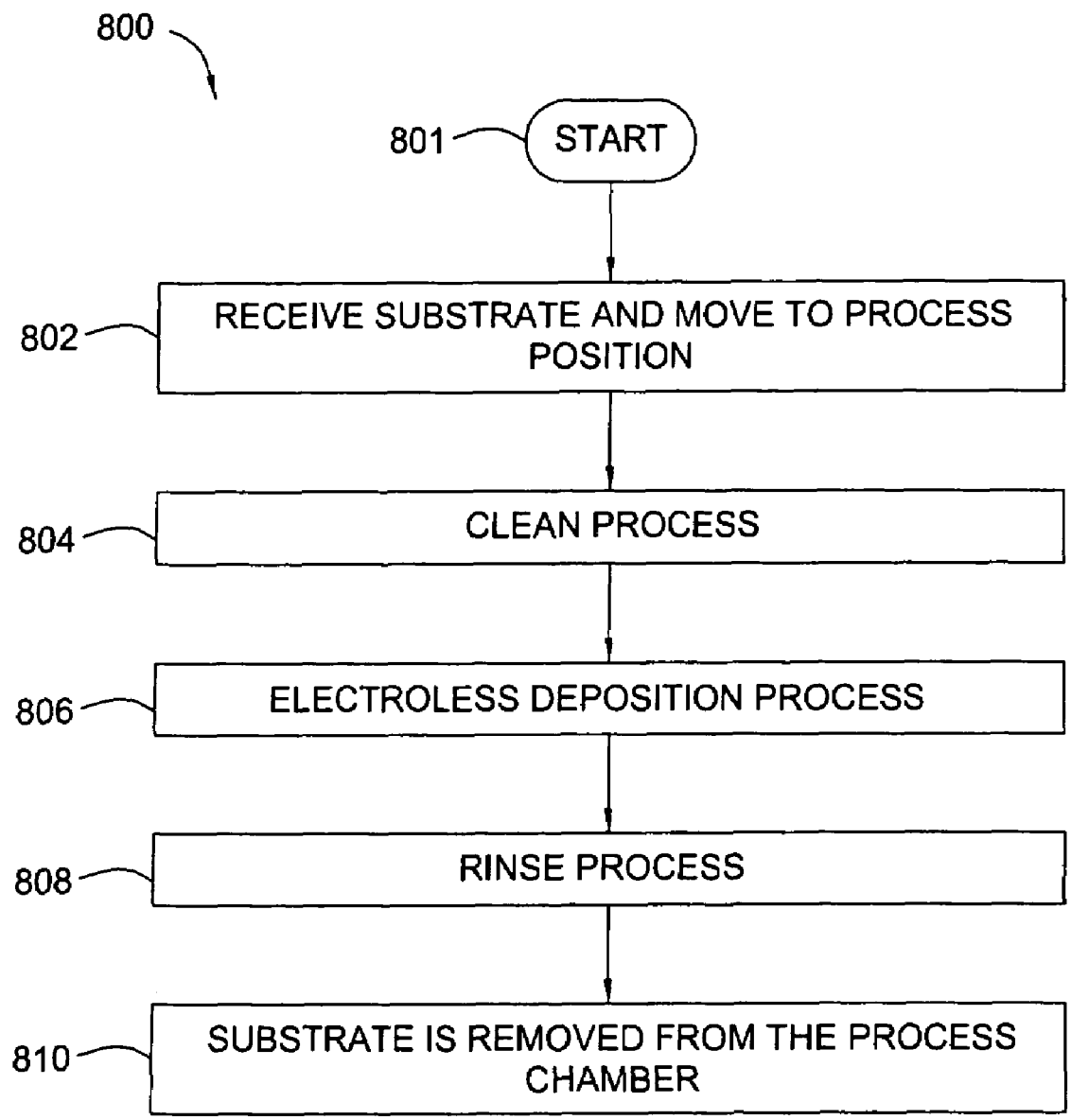
FIG. 7 illustrates yet another embodiment of the method steps 800 for completing an electroless process.

FIG. 7 illustrates another embodiment of the series of general method steps 800, which include steps 801 through 810, that generally describe the basic steps completed during an electroless process. Specifically, FIG. 7 begins at step 801, the substrate is then received by the fluid processing cell 600 and is moved into a processing position (step 802), a cleaning process is completed on the substrate (step 804), an electroless process is completed on the substrate (step 806), the substrate is rinsed and/or cleaned (step 808), and then the substrate is removed from the chamber (step 810). The embodiment, illustrated in FIG. 7, differs from the embodiment described in FIG. 5 because the rinse step 805 is not completed between the steps 804 and 806. In one embodiment, after the cleaning process (step 804) has been completed the cleaning fluid is stopped (or slowly phased out) as the electroless process (step 806) begins. In another embodiment the cleaning fluid continues to flow as the electroless process (step 806) is completed. In this embodiment the concentration of cleaning fluid may be adjusted as necessary to complete the electroless deposition process.

Figure 6:
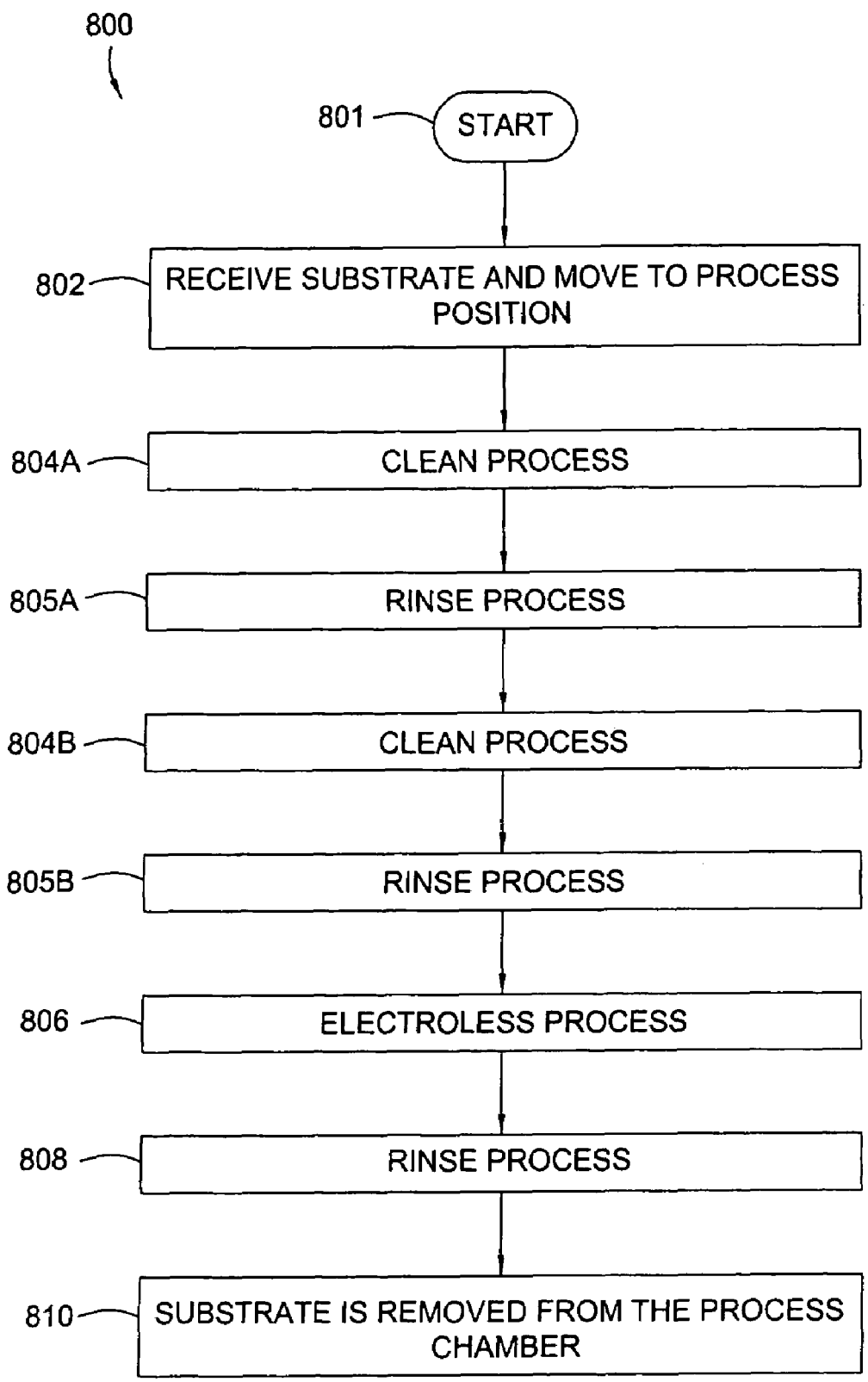
FIG. 6 illustrates another embodiment of the method steps 800 for completing an electroless process.
Figure 8:
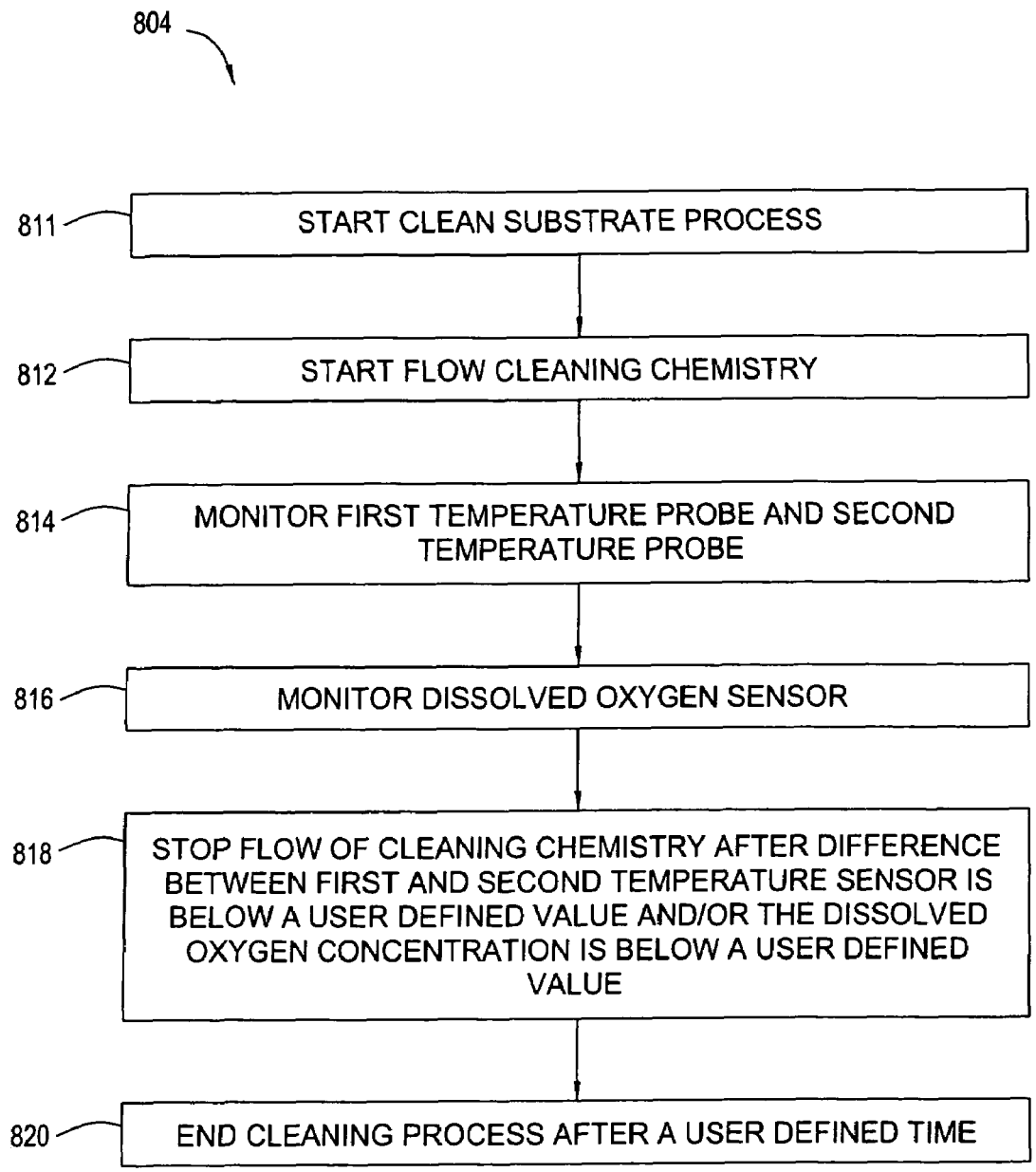
FIG. 8 illustrates an embodiment of the method steps 804 for completing an electroless process.

FIG. 8 illustrates the method steps found in the more generally described clean process method step labeled step 804 in FIG. 5 or FIG. 7 and steps 804A and 804B in FIG. 6. In one embodiment of the present invention the cleaning process is completed once the substrate has been received and positioned (step 802) such that the surface, or surfaces, of the substrate can be cleaned using the following steps. In this embodiment the method steps of the clean step 804 generally may contain the steps: start the cleaning process (step 811), start flowing the cleaning chemistry (step 812), monitor the temperature of the incoming fluid temperature versus fluid temperature leaving the processing region 620 using a controller 300, a probe 151 and a probe 152 (step 814), monitor the dissolved oxygen concentration using probe 154 (step 816), stop the flow of cleaning chemistry when the temperature difference and/or the dissolved oxygen concentration is below a user defined value (step 818), and end the cleaning process after a user defined time (step 820). The user defined time to end the cleaning process can be between about 0 and about 90 seconds, and preferable about 30 seconds. The dissolved oxygen level in the cleaning chemistry tends to vary as the amount of trapped gas in the cleaning chemistry varies and as the cleaning process progresses towards completion. To reduce the variability of the dissolved oxygen in the cleaning chemistry, a fluid degassing unit 170 is incorporated into the inlet section 200. In one embodiment of method step 804 the step 814 is deleted and step 818 is modified such that the controller 300 will stop the flow of cleaning chemistry when the dissolved oxygen concentration is below a user defined value, in an effort to reduce chamber cost and complexity concerns.

In one embodiment of the clean process step 804 the cleaning chemistry used is a dielectric clean solution that may include one or more acids (such as citric acid, HF, and/or HCl) and may include one or more corrosion inhibitors. The corrosion inhibitors may include any of various chemical compounds, for example organic compounds containing an azole group, such as benzotriazole, mercapto-benzotriazole, or 5-methyl-1-benzotriazole. The dielectric cleaning step may be conducted with the heater 612 activated such that the substrate temperature is between about 20° C. and about 90° C. Generally, the dielectric clean solution is configured to remove metallic residues from the exposed portion of the dielectric layer. It is also believed that the corrosion inhibitor can protect the exposed portion of the copper layer during the dielectric clean process. If the metallic residues are not removed, unwanted electroless deposition will generally occur over these metallic residues on the dielectric material.

In another embodiment of the clean process step 804 the cleaning chemistry used is a suitable copper clean solution such as an Electra Clean™ solution commercially available from Applied Materials, Inc., of Santa Clara, Calif. Another example of a suitable copper clean solution includes sulfuric acid and HCl. Still another example of a suitable copper clean solution includes a mixture of citric acid and peroxide. The copper clean solution is generally configured to remove copper oxides. The copper clean solution may also be used to remove the corrosion inhibitor added to the dielectric clean solution remaining on the exposed portion of the copper layer from a prior process. Corrosion inhibitor remaining on the exposed portion of the copper layer may inhibit formation and/or adhesion of the electroless deposition process material thereover in subsequent processing steps.

In another embodiment of the general method steps 800 a two step cleaning process is completed prior to the electroless process, as shown in FIG. 6. Specifically, FIG. 6 begins at step 801, the substrate is then received by the head assembly 604 in the fluid processing cell 600 and is moved into a processing position (step 802), a first cleaning process is completed on the substrate (step 804A), then the substrate is rinsed using a rinsing solution (step 805A), a second cleaning process is completed on the substrate (step 804B), then the substrate is rinsed using a rinsing solution (step 805B), then an electroless process is completed on the substrate (step 806), then the substrate is rinsed and/or cleaned (step 808) and then the substrate is removed from the chamber (step 810). The steps used to complete the first cleaning process (step 804A) and the second cleaning process (step 804B) are generally described in the method steps 804 shown in FIG. 8. In one embodiment the cleaning chemistry used in the first cleaning process (step 804A) is a dielectric clean solution (described above) and the cleaning chemistry used in the second cleaning process (step 804B) is a copper clean solution (described above). The steps used to complete the rinse process in step 805A and the rinse process in step 805B contains the steps described in the method steps 805 shown in FIG. 9.

Figure 9:
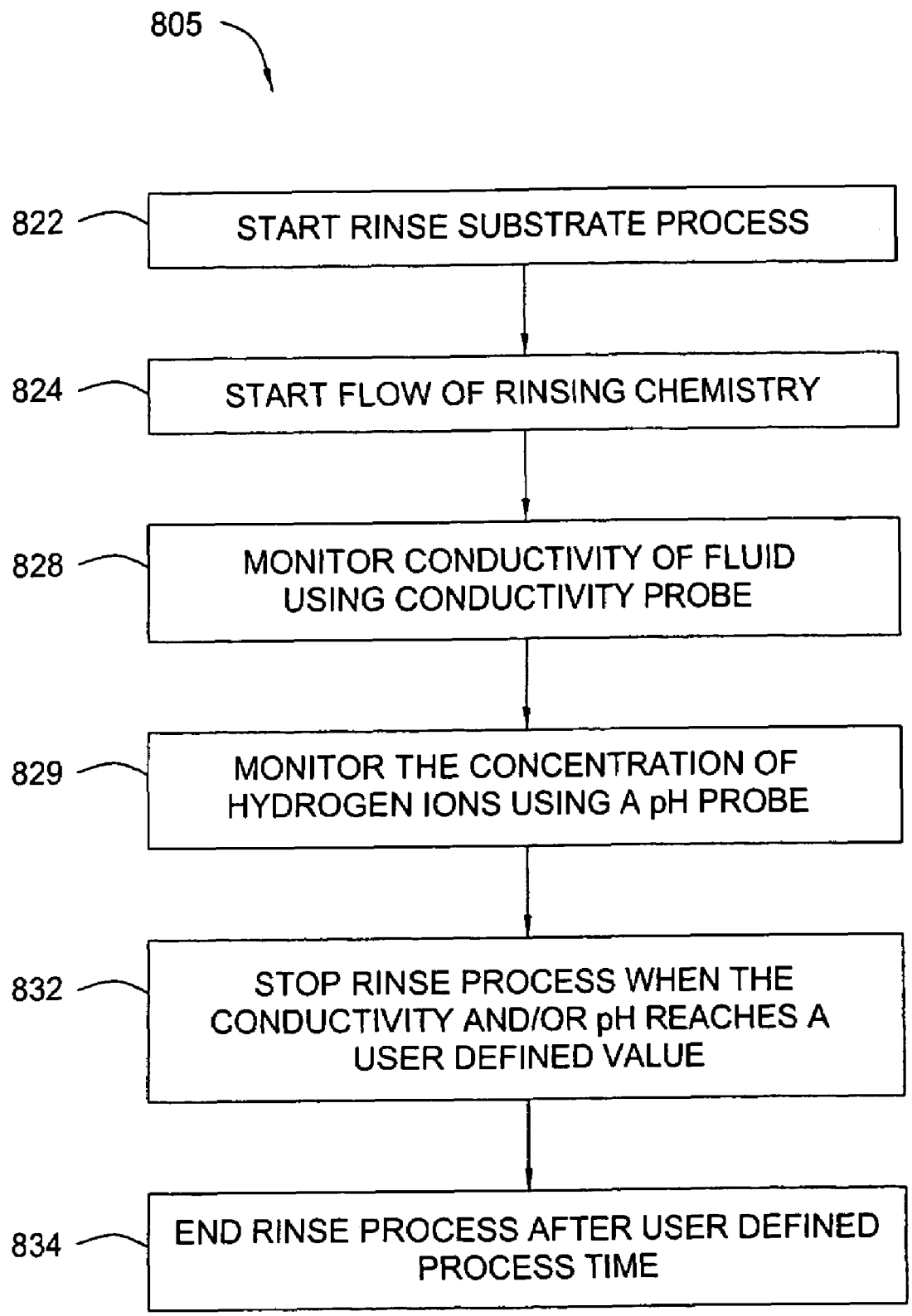
FIG. 9 illustrates an embodiment of the method steps 805 for completing an electroless process.

FIG. 9 illustrates the method steps found in the more generally described substrate rinse process method steps described in method step 805. In one embodiment of the present invention the substrate rinse process is completed once the substrate has been received and positioned (step 802 of FIG. 5) such that the surface, or surfaces, of the substrate can be rinsed using the following steps. In this embodiment the method steps of the substrate rinse step 805 contains the steps: start the rinse substrate process (step 822), start the flow of rinsing chemistry (step 824), monitor the conductivity of the rinsing chemistry using the controller 300 and the probe 156 (step 828), monitor the pH of the rinsing chemistry using the controller 300 and the probe 155 (step 829), stopping the flow of rinse solution when the conductivity and/or the pH of the solution is below a user defined value (step 832), and then ending the cleaning process after a user defined time (step 834). The rinsing chemistry described in step 824 is generally de-ionized water or other solvent that is effective in removing chemistry used in the prior process and will not itself contaminate any subsequent processing steps. The user defined time to end the rinse process can be between about 0 and about 30 seconds. In other embodiments of method step 805, either step 828 or step 829 may removed, and step 832 may be modified accordingly, to reduce the complexity or cost of completing the electroless process.

Figure 10A:
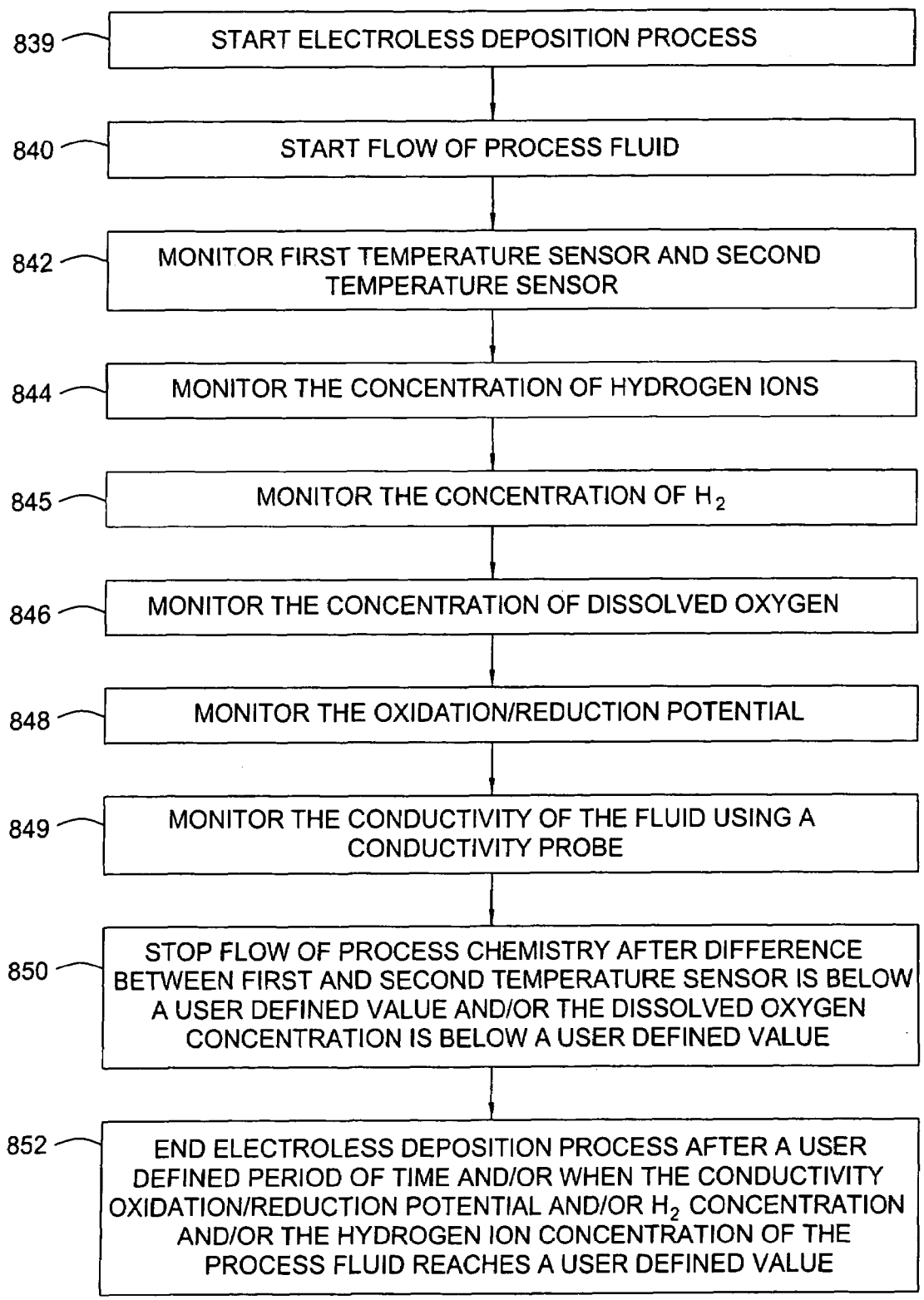
FIG. 10A illustrates one embodiment of the method steps 806 for completing an electroless process.

FIG. 10A illustrates the method steps found in the more generally described electroless process step described in method step 806. In one embodiment of the present invention the electroless process step is performed once the substrate has been received and positioned (step 802) such that the surface, or surfaces, of the substrate can be processed using the following steps. In this embodiment the method steps of the electroless deposition step 806 contains the steps: Start the electroless process (step 839); start the flow of a processing fluid (step 840); monitor the temperature of the incoming processing fluid temperature versus fluid temperature leaving the processing region 620 using a controller 300, a probe 151 and a probe 152 (step 842); monitor the hydrogen concentration of the processing fluid using probe 155 (step 844); monitor the dissolved hydrogen concentration of the processing fluid using probe 158 (step 845); monitor the dissolved oxygen concentration of the processing fluid using probe 154 (step 846); monitor the oxidation/reduction potential of the processing fluid using probe 153 (step 848); monitor the conductivity of the processing fluid using probe 156 (step 849), stop the flow of processing fluid when the temperature difference and/or the dissolved oxygen level is below a user defined value (step 850); and end the electroless process step after a user defined time and/or when the oxidation/reduction potential as measured using probe 153, when the conductivity of the processing fluid as measure by probe 156, when the dissolved hydrogen in the processing fluid as measured by probe 158 and/or the hydrogen concentration as measured by probe 155 reaches a user defined value (step 852). In this embodiment the probes (e.g. probe 153, probe 155, etc.) will need to be in contact with the processing fluid in the processing region 620 to allow the controller to monitor the process. The user defined time to end the electroless process step can be between about 0 and about 60 seconds. In other embodiments of method step 806, one or more of the monitoring steps (steps 842 through step 849) may removed, and steps 850 and 852 may be modified accordingly, to reduce the complexity or cost of completing the electroless process.

In one embodiment the processing fluid, used in step 840 is an activation solution. Examples of activation solutions include palladium salts include chlorides, bromides, fluorides, fluoborates, iodides, nitrates, sulfates, carbonyls, salts of metal acids, and combinations thereof. In one embodiment the palladium salts are chlorides, such as palladium chloride ($PdCl_2$). In another embodiment the palladium salt is a nitrate, alkanesulfonate, or another soluble derivative of $Pd^{+2}$ containing a non-coordinating anion not prone to cluster formation in either the solution or on the metal surface. In one embodiment the queue time (or wait time) between the end when the copper clean solution (in step 804) is applied and the start time of when the activation solution (in step 806) is applied is generally less than about 15 seconds, and preferably less than about 5 seconds. The activation solution generally operates to deposit an activated metal seed layer on to the exposed copper of the exposed features. As a consequence, oxidation of the exposed portion of the copper layer after cleaning thereof may be detrimental to subsequent process steps, since copper oxides are known to have a higher electrical resistivity than copper. The short queue time between copper clean and activation minimizes oxidation, while the use of an inert gas environment around the fluid processing cell may also help to prevent oxidation of the exposed portion of the copper layer.

In one embodiment the processing fluid, used in step 840 (e.g., process chemistry from FIG. 10A) is an electroless deposition solution. In one embodiment an electrolessly deposited capping layer is deposited which is an alloy containing CoP, CoWP, CoB, CoWB, CoWPB, NiB, or NiWB, and preferably includes CoWP or CoWPB. The electroless deposition solution used to form the capping layer may include one or more metal salts and one or more reducing agents, depending of the capping layer material to be deposited. The electroless deposition solution may also include pH adjusters, such as acids or bases, as is generally known in the art. When the selected capping layer contains cobalt, the electroless deposition solution generally includes a cobalt salt. Examples of cobalt salts include chlorides, bromides, fluorides, acetates, fluoborates, iodides, nitrates, sulfates, salts of other strong or weak acids, and/or combinations thereof. Preferably, the cobalt salt includes cobalt sulfate, cobalt chloride or combinations thereof. If a tungsten-containing capping material is to be deposited, the electroless deposition solution includes a tungstate salt. Preferably, the tungstate salt includes a salt of tungstic acid, such as ammonium tungstate or tetramethyl ammonium tungstate, or may be generated through the neutralization of the tungstic acid. If a nickel-containing capping material is to be deposited, the electroless solution generally includes a nickels salt. Examples of nickel salts include chlorides, bromides, fluorides, acetates, fluoborates, iodides, nitrates, sulfates, carbonyls, salts of strong or weak acids, and/or combinations thereof.

When the selected capping layer material includes phosphorus, such as CoP, CoWP, or CoWPB, the reducing agent preferably includes a phosphorus compound, such as the hypophosphite anion ($H_2PO_2$). If the capping material includes boron, such as CoB, CoWB, CoWPB, the reducing agent generally includes a boron compound, a dimethylamine-borane (DMAB), a non-alkali metal salt of a borohydride ($BH_4^-$) anion, or combinations thereof. Other reducing agents may also be used in addition to or alternatively with the reducing agents above, such as hydrazine. In one embodiment a borane co-reducing agent is used for processes that are initiated on copper.

The electroless deposition solution (processing fluid) and/or the substrate may be heated to a temperature of between about 40° C. and about 95° C. In one aspect, heating the electroless deposition solution and/or the substrate structure increases the electroless deposition rate. In one embodiment, the deposition rate of the capping material is about 100 Å/min or more. In one embodiment, the capping material is deposited to a thickness between about 100 Å and 300 Å, preferably about 150 Å to about 200 Å. However, it is important to maintain the temperature across the substrate at a uniform temperature, as the deposition rate of an electroless process is known to be highly dependent upon temperature. As such, the annular bands of heaters 612 illustrated in FIG. 1 (or substrate support member 962 in FIG. 4) and/or the heater 161 may be used.

Electroless process method step 806 generally contains steps 839 to 852. In one embodiment of step 806, steps 840 to 852 are sequentially repeated multiple times for each of the different electroless process steps (e.g., activation, deposition of a first metal, deposition of a second metal, etc.). A two step electroless process, for example, may require the following steps: Start the electroless process (step 839A); start the flow of a first process fluid (step 840A); monitor the temperature of the incoming processing fluid temperature versus fluid temperature leaving the processing region 620 using a controller 300, a probe 151 and a probe 152 (step 842A); monitor the hydrogen concentration of the processing fluid using probe 155 (step 844A); monitor the dissolved hydrogen concentration of the processing fluid using probe 158 (step 845A); monitor the dissolved oxygen concentration of the first processing fluid using probe 154 (step 846A); monitor the oxidation/reduction potential of the first processing fluid using probe 153 (step 848A); monitor the conductivity of the processing fluid using probe 156 (step 849A), stop the flow of first processing fluid when the temperature difference and/or the dissolved oxygen level is below a user defined value (step 850A); and end the second electroless process step after a user defined time and/or when the oxidation/reduction potential as measured using probe 153, when the conductivity of the processing fluid as measure by probe 156, when the dissolved hydrogen in the processing fluid as measured by probe 158 and/or the hydrogen concentration as measured by probe 155 reaches a user defined value (step 852A); start the second electroless process (step 839B); start the flow of a second process fluid (step 840B); monitor the temperature of the incoming processing fluid temperature versus fluid temperature leaving the processing region 620 using a controller 300, a probe 151 and a probe 152 (step 842B); monitor the hydrogen concentration of the processing fluid using probe 155 (step 844B); monitor the dissolved hydrogen concentration of the processing fluid using probe 158 (step 845B); monitor the dissolved oxygen concentration of the second processing fluid using probe 154 (step 846B); monitor the oxidation/reduction potential of the second processing fluid using probe 153 (step 848B); monitor the conductivity of the processing fluid using probe 156 (step 849B), stop the flow of second processing fluid when the temperature difference and/or the dissolved oxygen level is below a user defined value (step 850B); and end the second electroless process step after a user defined time and/or when the oxidation/reduction potential as measured using probe 153, when the conductivity of the processing fluid as measure by probe 156, when the dissolved hydrogen in the processing fluid as measured by probe 158 and/or the hydrogen concentration as measured by probe 155 reaches a user defined value (step 852B). In this embodiment the probes (e.g. probes 151, 152, 153, etc.) are in contact with the processing fluid in the processing region 620 to allow the controller 300 to monitor the process. In another embodiment a rinse step, such as step 805, is placed in between the last step 852A of the first deposition process and the first step 840B of the second deposition process to assure that the first process is completely stopped and any issues that may arise from the interaction of the first and second processing fluids is minimized. It should be noted that the multiple processing fluids used in the electroless deposition step 806 are made up of multiple components, for example, a metal ion containing solution (e.g., solution A, etc.), a reducing agent (e.g., solution B, etc.), and a solvent (e.g., deionized water, etc.). In the above embodiment the first processing fluid may be an activation solution (described above) and the second processing fluid may be an electroless deposition fluid (described above), for example.

Figure 10B:
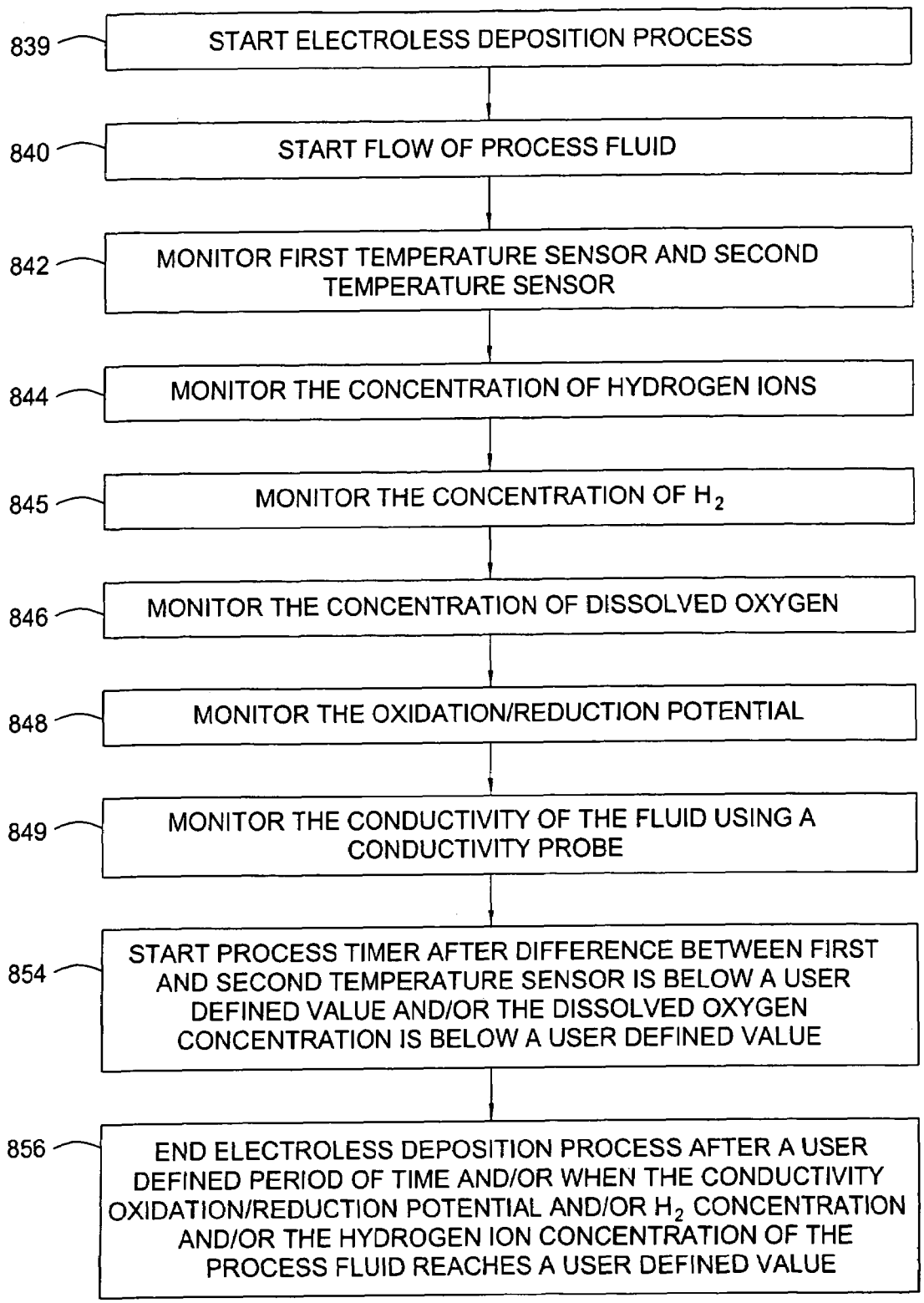
FIG. 10B illustrates another embodiment of the method steps 806 for completing an electroless process.

In another embodiment of the electroless deposition method step 806, shown in FIG. 10B, the electroless process step may be completed using a constant flow of chemistry to facilitate replenishment of fresh process chemistry into the process region and to also facilitate the detection of the end of the electroless process step while minimizing the possibility of process contamination from the probes in the processing region 620. The embodiment illustrated in FIG. 10B contains the steps: Start the electroless process (step 839); start the flow of a process fluid (step 840); monitor the temperature of the incoming processing fluid temperature versus fluid temperature leaving the processing region 620 using a controller 300, a probe 151 and a probe 152 (step 842); monitor the hydrogen concentration of the processing fluid using probe 155 (step 844); monitor the dissolved hydrogen concentration of the processing fluid using probe 158 (step 845); monitor the dissolved oxygen concentration of the processing fluid using probe 154 (step 846); monitor the oxidation/reduction potential of the processing fluid using probe 153 (step 848); monitor the conductivity of the processing fluid using probe 156 (step 849), start the process timer when the temperature difference and/or the dissolved oxygen level is below a user defined value (step 854); and end the second electroless process step after a user defined time and/or when the oxidation/reduction potential as measured using probe 153, when the conductivity of the processing fluid as measure by probe 156, when the dissolved hydrogen in the processing fluid as measured by probe 158 and/or the hydrogen concentration as measured by probe 155 reaches a user defined value (step 856). The user defined time to end the electroless process step can be between about 0 and about 60 seconds.

In another embodiment of the electroless process method step 806, illustrated in FIG. 10B, the process steps 839 to 856 are sequentially repeated multiple times for each of the different electroless process steps (e.g., activation, deposition of a first metal, deposition of a second metal, etc.). In another embodiment, after the first electroless process (steps 839A-856A (not shown)) the first processing fluid is reduced, or slowly phased out or stopped, while a second electroless process (steps 839B to 856B (not shown)) is started and completed using a second processing fluid. In another embodiment a rinse step, such as step 805, is placed in between the last step 856A (not shown) of the first deposition process and the first step 839B (not shown) of the second deposition process to assure that the first processing step is completely stopped and any issues that may arise from the interaction of the first and second processing fluids is minimized. In some embodiments of the present invention it may be useful to time the stopping and starting of the different processing fluids such that they maintain a constant flow rate through the processing region 620 is maintained. In some cases it may be advantageous to overlap the starting or stopping of the various chemistries so that the concentration of one component drops off until it reaches zero (phased out), while the concentration of the other chemistry increases until it reaches a steady state value (phased in).

Figure 11:
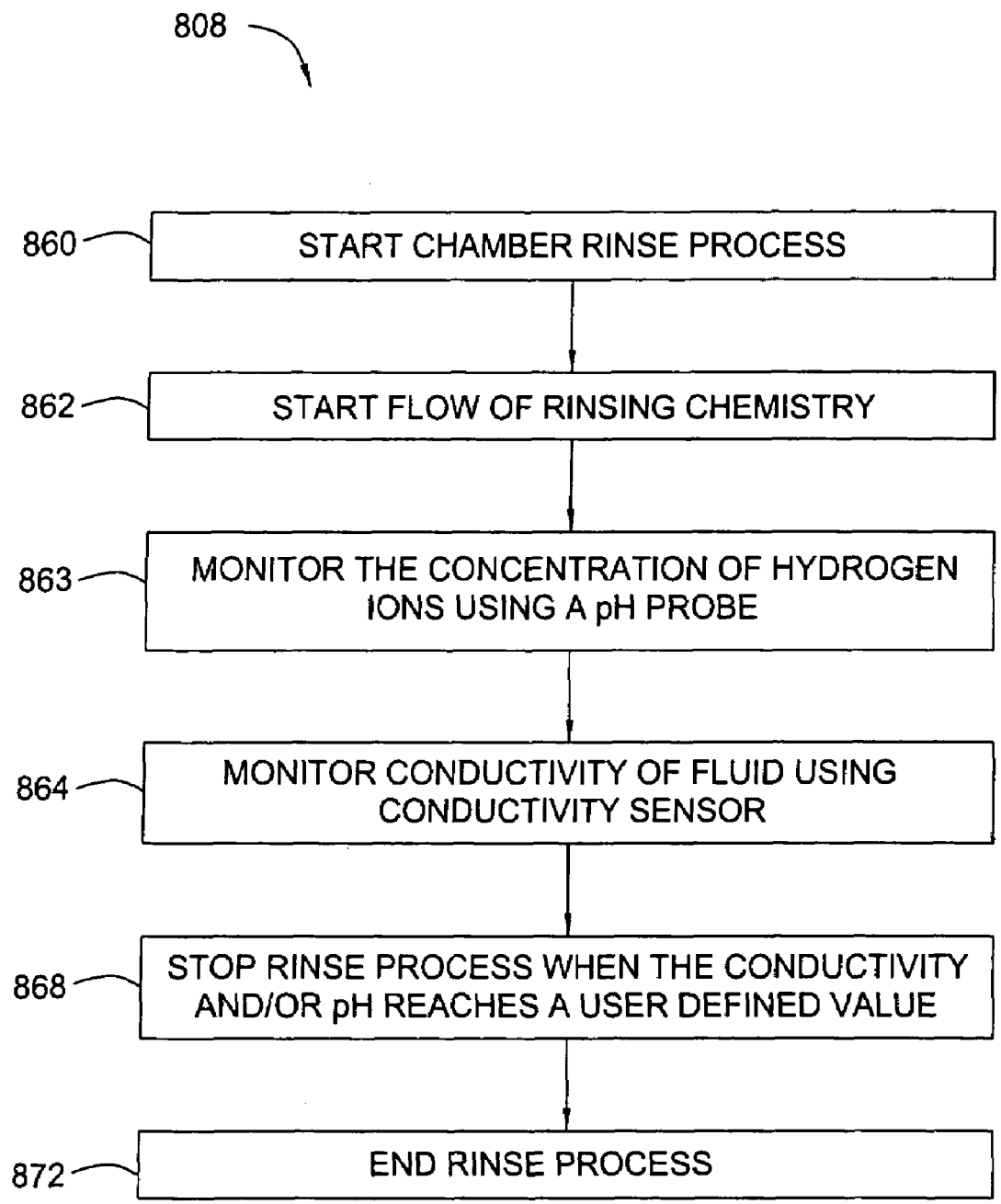
FIG. 11 illustrates one embodiment of the method steps 808 for completing an electroless process.

FIG. 11 illustrates the method steps found in the more generally described substrate rinse and/or cleaning process method step, depicted in step 808. In one embodiment of the present invention the substrate rinse process is completed once the substrate has been received and positioned (step 802 of FIG. 5) such that the surface, or surfaces, of the substrate can be rinsed using the following steps. In this embodiment the method steps of the substrate rinse process step 808 will contain the steps: start the rinse process (step 860), start the flow of rinsing chemistry (step 862), monitor the pH of the fluid leaving the processing region 620 using the controller 300 and the probe 155 (step 863), monitor the conductivity of the fluid leaving the processing region 620 using the controller 300 and the conductivity probe 156 (step 864), stop the flow of rinse solution when the conductivity and/or pH of the solution leaving the processing region 620 is below a user defined value (step 868), and end the rinse and/or cleaning process after a user defined time (step 872). The rinsing chemistry described in step 808 is generally de-ionized water or other solvent that is affective in removing chemistry used in the prior process and will not itself contaminate any subsequent processing steps. The user defined time to end the rinse process can be between about 0 and about 30 seconds. Utilizing the conductivity sensor to determine the end of the rinse process step can greatly reduce the possibility of process contamination due to insufficient rinsing of the substrate. The use of a conductivity sensor can also reduce the amount of wasted rinsing solution due to over rinsing the substrate to assure that the substrate surface is completely free of chemistry or contaminants from the prior process step(s). In other embodiments of method step 808, either step 863 or step 864 may removed, and step 868 may be modified accordingly, to reduce the complexity or cost of completing the electroless process.

In one embodiment the rinsing chemistry in step 808 is a post-activation cleaning chemistry which is used where the prior electroless process (step 806) is an activation process. The post-activation clean solution may include one or more acids (such as citric acid, glycine, HF, and/or HCl alone or in combination with various chelating agents such as EDTA). In one embodiment the post-activation rinse may include an additional step utilizing a solution of a neutral pH (which may include de-ionized water) and/or a solution of basic pH close to the pH of the solution used in the subsequent electroless plating step. In the later case the solution may consist of TMAH or $NH_4OH$ neutralized/buffered solution of citric acid, glycine, or EDTA adjusted between pH values of 7.0 and 9.5. The queue time between the end of the activation process (step 806) and start of when the post-activation clean process (step 808) may be less than about 15 seconds, and preferably less than about 5 seconds. The post-activation clean solution generally operates to remove any of the activation metal seed layer from the exposed portion of the dielectric layer so that the activation metal seed layer remains only on the exposed portion of the copper layer. Remaining activation metal seed layer on the exposed portion of the dielectric layer may cause undesirable electroless deposition thereover.

In another embodiment the rinsing chemistry in step 808 is a post-deposition cleaning chemistry where the prior electroless process (step 806) is an electroless process. The post-deposition clean may include one or more dilute acids such as citric acid, glycine, acetic, or phosphoric acid in DI water with a pH value between about 2.0 and about 7.0. The post-deposition clean is generally configured to remove capping material or dissolved metallic ions that may be present on the exposed surface of the dielectric layer.

While the foregoing is directed to embodiments of the present invention, other and further embodiments of the invention may be devised without departing from the basic scope thereof, and the scope thereof is determined by the claims that follow.

What is claimed is:

1. An electroless deposition system, comprising:
   a fluid processing chamber having a processing region, a fluid inlet port and a fluid outlet port wherein the fluid inlet port and the fluid outlet port are in communication with the processing region;
   a first probe mounted in the fluid inlet port, in the processing region or in the fluid outlet port;
   a second probe mounted in the fluid inlet port, in the processing region or in the fluid outlet port;
   a third probe mounted in the fluid inlet port, in the processing region or in the fluid outlet port;
   a controller adapted to receive a signal from the first probe, the second probe and the third probe, and process the signals to determine that a desired value has been reached, and is further adapted to control the electroless deposition system;
   a first temperature sensor mounted at the fluid inlet port;
   a second temperature sensor mounted-at the fluid outlet port; and
   the controller further adapted to receive a signal from the first temperature sensor and the second temperature sensor and process the signals to determine that a desired value has been reached, and is further adapted to control the electroless deposition system.

* * * * *

UNITED STATES PATENT AND TRADEMARK OFFICE
CERTIFICATE OF CORRECTION

| | |
|---|---|
| PATENT NO. | : 7,465,358 B2 |
| APPLICATION NO. | : 10/794592 |
| DATED | : December 16, 2008 |
| INVENTOR(S) | : Weidman et al. |

It is certified that error appears in the above-identified patent and that said Letters Patent is hereby corrected as shown below:

Column 9, Line 13, please delete "probe159" and insert --probe 159-- therefor;

Column 19, Line 12, please delete "$NH_40H$" and insert --$NH_4OH$-- therefor.

Signed and Sealed this

Twenty-eighth Day of April, 2009

JOHN DOLL
*Acting Director of the United States Patent and Trademark Office*